United States Patent
Wallner et al.

(10) Patent No.: US 7,415,581 B2
(45) Date of Patent: *Aug. 19, 2008

(54) SEMICONDUCTOR MEMORY CHIP

(75) Inventors: Paul Wallner, Prien (DE); Yukio Fukuzo, München (DE); Christian Sichert, München (DE); Paul Schmölz, München (DE)

(73) Assignee: Infineon Technologies AG, Neubiberg (DE)

( * ) Notice: Subject to any disclaimer, the term of this patent is extended or adjusted under 35 U.S.C. 154(b) by 262 days.

This patent is subject to a terminal disclaimer.

(21) Appl. No.: 11/242,149

(22) Filed: Oct. 4, 2005

(65) Prior Publication Data

US 2007/0076004 A1    Apr. 5, 2007

(51) Int. Cl.
*G11C 7/08* (2006.01)
*G11C 11/4063* (2006.01)
(52) U.S. Cl. .............. 711/154; 365/230.03; 365/189.05
(58) Field of Classification Search ................. 711/154; 365/230, 189, 233
See application file for complete search history.

(56) References Cited

U.S. PATENT DOCUMENTS

| | | | | |
|---|---|---|---|---|
| 5,369,617 A | * | 11/1994 | Munson | 365/219 |
| 5,737,563 A | * | 4/1998 | Shigeeda | 711/5 |
| 5,898,623 A | * | 4/1999 | Clinton et al. | 365/189.04 |
| 5,950,223 A | * | 9/1999 | Chiang et al. | 711/105 |
| 6,000,007 A | * | 12/1999 | Leung et al. | 711/105 |
| 6,028,807 A | * | 2/2000 | Awsienko | 365/230.02 |
| 6,178,517 B1 | * | 1/2001 | Bertin et al. | 713/324 |
| 7,221,615 B2 | * | 5/2007 | Wallner et al. | 365/230.03 |
| 2005/0180255 A1 | | 8/2005 | Tsern et al. | |

* cited by examiner

*Primary Examiner*—Hyung S. Sough
*Assistant Examiner*—Kenneth M Lo
(74) *Attorney, Agent, or Firm*—Edell, Shapiro & Finnan, LLC (57) ABSTRACT

A semiconductor memory chip in which signals are transferred as serial signal frames includes a frame decoder providing an interface between a memory core and a reception interface. The frame decoder includes a command type decoder for decoding the types of commands included in frames according to the decoded type of the commands, a memory command evaluator/generator for scheduling and preparing single commands for the core, an intermediate data buffer command evaluator/generator for scheduling and preparing control signals for an intermediate data buffer, and a system command evaluator/generator for preparing and scheduling system commands. These system commands provide timing parameters to ensure time intervals between consecutive commands within one frame or between frames and are stored in a system mode register. The operation of the frame decoder is edge-synchronized by a frame clock or a synchronization decoder clock signal which is phase-aligned to that frame clock signal.

11 Claims, 5 Drawing Sheets

Table:

| Timing Param. | Stream | |
|---|---|---|
| tRC (RAS cycle Time) | ACT-A -..- ACT-A | * |
| tRRD (RAS-RAS delay time) | ACT-A -..- ACT-B | * |
| tRAS (bank active time) | ACT-A -..- PRE-A | * |
| tRP (bank precharge time) | PRE-A -..- ACT-A | * |
| tRCD (RAS-CAS time) | ACT-A – READ-A | * |
| tCCD (CAS-CAS delay) | READ-A -..- READ-B | * |
| tWR (write recovery time) | End dq burst - PRE | |
| tCL (CAS latency) | READ-A – start dq burst | |
| tRTP (internal read to precharge delay) | READ-A – PRE-A | |
| tRFC | REF-A - ANY | * |

A : Bank # A
B : Bank # B
* may be ensured by mem. controller

SEMICONDUCTOR MEMORY CHIP

FIELD OF THE INVENTION

The present invention generally relates to semiconductor memory chips and in particular to a semiconductor memory chip including transmission and reception interface sections each for transmitting and receiving data, command, and address signals in the form of serial signal frames in accordance with a predefined protocol via respective data/command and address signal lines to/from a memory controller.

BACKGROUND

Existing conventional DRAMs do not employ frames for data transfer. Data signals, such as write data, command, and addresses are transmitted in parallel through separate data, command, and address signal busses from a memory controller to one or more semiconductor memory chips (DRAM).

In future DRAM memory systems and memory chips data will be transmitted at very high frequencies. The data transfer will likely be ruled by a protocol with the data bits being organized in frames in accordance with the protocol. After several alignment procedures, for example, a data stream is demultiplexed to a lower frequency and ready for evaluation. Such a novel semiconductor memory chip must include a frame decoder unit to decode the signal frames to: (a) memory relevant commands; (b) system commands; and (c) write data to be intermediately stored in an intermediate data buffer "IDB." Each frame can contain one or more memory relevant commands. Further, commands dedicated to the same bank can be placed in different frames.

SUMMARY

The present invention provides a semiconductor memory chip having a frame decoder which is able to decode and handle memory relevant commands, system commands and the transfer of write data to the IDB or from the IDB to the memory core, and which takes into account several features like timing parameters, different frequencies and clock domains of the memory core and the frame decoder, multi-bank access, multi-command frames, or multi command types within one frame.

According to an exemplary embodiment, a semiconductor memory chip of the present invention includes:

transmission and reception interface sections for respectively transmitting and receiving data, command, and address signals in serial signal frames configured in accordance with a predefined protocol via respective data, command, and address signal lines to/from a memory controller and/or to/from another same memory chip;

an intermediate data buffer configured for intermediate storage of write data;

a memory core including a bank-organized memory cell array and address decoder for decoding an address derived from a signal frame received from the reception interface section for writing/reading data in/from at least one memory bank of the memory cell array in accordance with a write/read command within one or more received signal frames;

a system mode register configured to store command-relevant timing parameters not being supplied in an actual frame from the memory controller, the timing parameters respectively indicating a number of clock cycles of a synchronizing decoder clock signal; and a frame decoder providing an interface between the memory core and the reception interface section and receiving frame signals from and the reception interface section, the frame decoder including:

a command type decoding section arranged configured to decode a command type of one or more commands included in one or more frames and outputting control signals in accordance with each decoded type of the commands;

a memory command evaluator/generator section configured to schedule and prepare commands for the memory core;

an intermediate data buffer command evaluator/generator section configured to schedule and prepare control signals for the intermediate data buffer; and a system command evaluator/generator section configured to prepare and schedule system commands, wherein:

the memory command evaluator/generator, intermediate data buffer command evaluator/generator, and system command evaluator/generator sections are operated by control signals received from the command type decoding section in accordance with the decoded type of the commands; and at least the memory command evaluator/generator section, the intermediate data buffer, and the intermediate data buffer command evaluator/generator section are operable in synchronism with the synchronizing decoder clock signal.

The reception interface section of the semiconductor memory chip can further include a CRC-bit decoder for evaluating CRC-bits within the signal frames and checking correctness/incorrectness of commands and data in each signal frame, wherein the frame decoder further includes a wrong command protection unit for releasing to the memory core only commands checked by the CRC-bit decoder as being correct.

The memory command evaluator/generator section of the frame decoder can include a command evaluator and generator and for each memory bank of the memory core: a command buffer configured to buffer: a) one or more memory commands included in a presently decoded signal frame and in previous commands and, if defined by the protocol for a presently decoded command, the last command of the preceding frame; and b) a time parameter from the system mode register in association with each buffered command; a counter unit configured to count clock cycles of the synchronizing decoder clock signal;

a comparator configured to compare a count value of the counter unit with a buffered timing parameter associated with the presently decoded command; and a reset unit configured to reset the counter unit, wherein each time the comparator detects matching between the count value of the counter unit and the associated buffered timing parameter, the command buffer releases the command to the respective memory bank and enables the reset unit to reset the counter unit.

If no further command arrives after releasing a command to the core, the counter starts (usually at zero) and counts to the maximum value and stops there. When a new command arrives, the needed timing parameter is always smaller than or equal to the counter value, i.e., the maximum counter value, and the command can be released immediately to the core without delay.

If two or more commands are buffered in the command buffer, the command evaluator and generator of the memory command evaluator/generator section rearranges the memory commands in the correct consecutive order, and with the last frame by which a certain memory bank has been accessed and from which the last memory command has to been stored in the command buffer derives the timing parameters from the system mode register on a command-to-command basis, and stores the timing parameters respectively in association with the rearranged commands in the command buffer. The size of the counter unit is in accordance with a greatest possible minimum timing parameter between two consecutive commands. This minimum timing parameter could be t(ACT-PRE).

To be able to handle and decode successive intra-bank commands, that are commands dedicated to the same bank, which may be included in different frames as well as inter-bank commands, the counter unit of an exemplary embodiment of the present invention includes a first counter provided for each bank of the memory cell array and configured to measure respective timing parameters of multiple intra-bank commands. The command evaluator and generator of the memory command evaluator/generator section includes at least one second counter configured to measure timing parameters of inter-bank commands. The frame decoder and the memory command evaluator/generator section are synchronized by the decoder clock signal to release data and commands to the memory core at a clock edge of the decoder clock signal.

The frame decoder is a synchronous unit operated with and synchronized by the decoder clock signal which may be equal to the frame clock signal or derived therefrom and has a high frequency. By way of a non-limiting example, the frame decoder clock frequency can be below 1 GHz scaled to data rates of 3.6 to 7.2 Gbit/s. The core of the memory and the address decoder within the memory core are operated at a lower frequency, for example in the range of 100-200 MHz. This means that the memory core and the frame decoder are operated at different frequencies, and the components of the frame decoder are required to match the different frequencies. Moreover a number of timing parameters exist, which define the minimum time duration between certain memory commands. In order to fulfill these timing parameters, the frame decoder needs to be operated at a higher frequency, that is, the frame decoder must have a higher resolution than the actual memory core. Both, the memory core and the frame decoder belong to different clock domains and are not synchronized to each other. Preferably, the ratio of the synchronizing decoder clock signal frequency and the operating frequency of the memory core is in a range from 2 to 5.

Focusing on the frame decoder, the present semiconductor memory chip performs following functions. Signal frames arrive from the reception interface section at the frame decoder with the frame clock or the decoder clock signal frequency. The frequency of the frame clock corresponds to the data rate/frame length. In the command type decoding section, the type of the command is decoded. Based upon the command type, write data is written to the intermediate data buffer IDB, system command data is written to a system mode register or handled together with a master global control finite state machine, and memory relevant commands are decoded. In parallel, the CRC bit decoder evaluates the CRC bits within the frame, and the wrong command protection unit of the frame decoder releases commands only if the CRC check is OK.

In general, memory relevant commands can be reduced to a minimum set of commands: ACT (bank open), READ (read out array data), WRITE-RET (write data from IDB to memory array) and PRE (close bank). A refresh operation can be decoded as ACT+PRE. In previous DRAM generations, other commands like power down entry/exit or EMRS/MRS exist, but are here of no relevance because the overall system which includes the semiconductor memory chips of the present invention is affected and must therefore be handled considering more general system aspects.

The system mode register stores each relevant timing parameter as a number of clock cycles (with respect to the frame clock or to the synchronizing decoder clock signal). If more than one memory relevant command to one bank is included in a single frame, the frame decoder arranges the correct order, for example ACT+READ decoded in a single frames leads to: 1) ACT, 2) READ. The relevant timing parameters for a certain command are supplied from the system mode register and associated with the present command. However, for selection of relevant timing parameters, previous commands are taken into account. Moreover, as previous noted, it is not necessary that the command buffer be empty. A consecutive frame could include another READ which has to be scheduled and the previous order may have to be rearranged.

The command buffer stores at least one command and the associated timing parameter as derived from the system mode register. The first counter provided for the actual bank is started. The counter starts with the release of a command to the core. If there is no further command imminent, the counter will reach its maximum value and stops. The next arriving command will recognize the maximum counter value and will be released without any delay, and the counter will start to count again. When the counter value and the timing parameter value are equal, the memory command is sent to the memory core. The command buffer may contain several memory commands released in consecutive order depending on the timing value stored in the command buffer.

The above and still further objects, features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The accompanying drawings, which are incorporated in and constitute a part of the specification, illustrate a presently preferred embodiment of the invention and together with the general description given above and the detailed description given below serve to explain the principles of the invention.

DETAILED DESCRIPTION

Figure 1:
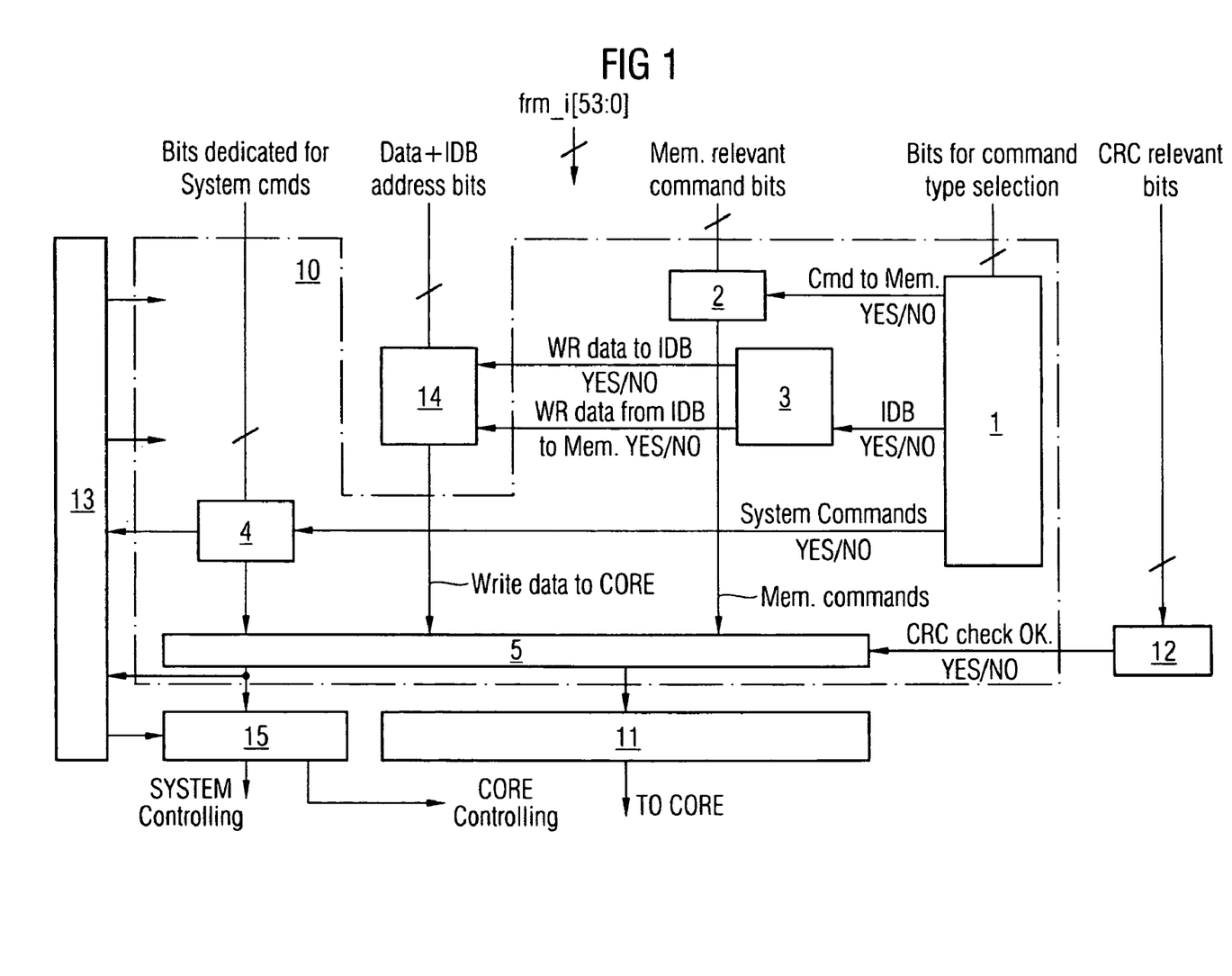
FIG. 1 is a general overview in form of a functional block diagram of a frame decoder and functionally relating other components of the present semiconductor memory chip.

The functional block diagram depicted in FIG. 1 shows an exemplary embodiment of a frame decoder generally designated with a reference numeral 10, an interface section 11 to the memory core which is connected to the frame decoder 10 to receive memory relevant commands and buffered write data from an intermediate data buffer (IDB) 14. A system mode register 13 is provided to store the timing parameters sent from a memory controller (not shown). To setup the system mode register 13, the memory controller sends frames with system commands delivering the timing parameters for storage. The timing parameters each designate a specific timing by a number of clock cycles either of a frame clock signal or a decoder clock signal (to be described later). Here, only those timing parameters which are not ensured by the memory controller are of interest.

Figure 6:
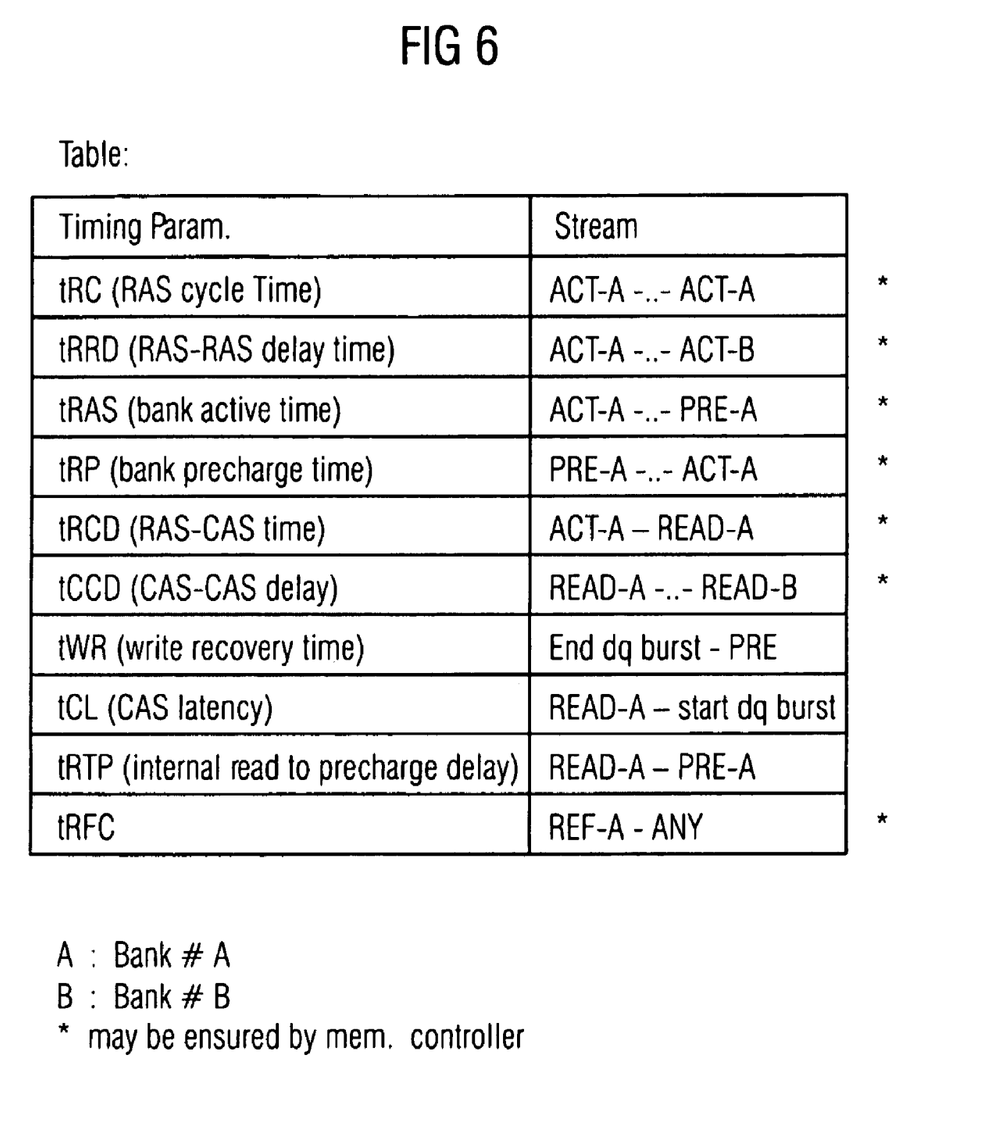
FIG. 6 shows a table listing several different timing parameters in association to combined commands.

In view of the timing parameters which are at least partly to be stored in the system mode register (13 in FIG. 1), the table of FIG. 6 lists some relevant timing parameters, their meaning and association to successive commands. Commands, which are designated with an asterisk (*) are not necessarily stored in the system mode register but may be ensured by the memory controller. It can be seen from FIG. 6 that timing parameters such as tRRD and tCCD are associated with consecutive commands for different memory banks.

FIG. 1 further shows a CRC bit decoder 12 receiving CRC relevant bits from each frame and being arranged for evaluating the CRC bits within the frame and checking correctness/incorrectness of command(s) and data in each signal frame. The CRC bit decoder 12 is operatively connected to a wrong command protection unit 5 that is part of the frame decoder 10. A further component of the present semiconductor memory chip is a master global control finite state machine 15 provided for controlling the system and the memory core and receiving system commands from a system command/evaluator generator section 4, which is also a part of the present frame decoder 10. The frame decoder 10 includes as its main components a command type decoding section 1 arranged for decoding the types of one or more commands included in one or more frames. The command type decoding section 1 receives from the frame(s) bits for command type selection and outputs different control signals, a) "command to memory yes/no" to a memory command evaluator/generator section 2 arranged for scheduling and preparing of single commands to the CORE, b) "IDB yes/no" to the intermediate data buffer command evaluator/generator section 3 arranged for scheduling and preparing of control signals to the intermediate data buffer IDB 14 and c) "system command yes/no" to a system command evaluator/generator section 4 arranged for preparing and scheduling of system commands mainly to the system mode register 13 and also to the master global control finite state machine 15.

As described, the memory command evaluator/generator section 2, the intermediate data buffer command evaluator/generator section 3 and the system command evaluator/generator section 4 are operated by the control signals from the command type decoding section in accordance with the decoded type of the command(s).

The components of the frame decoder 10, namely the command type decoding section 1, the memory command evaluator/generator section 2, the intermediate data buffer command evaluator/generator section 3, the system command evaluator/generator section 4, and the wrong command protection unit 5 are operating in synchronism with a synchronizing clock signal, which may be a frame clock signal or a synchronizing decoder clock signal which is in phase with the frame clock signal but has a higher frequency than the latter.

In the embodiment shown in FIG. 1, the IDB 14 is arranged in the write data path before the wrong command protection unit 5. However, it may be advantageous to place the IDB 14 outside, i.e., after the wrong command protection unit 5, so that the write data to be intermediately stored in and read from the IDB can also be protected by the wrong command protection unit 5. That is, several different arrangements of the IDB are possible.

Figure 2:
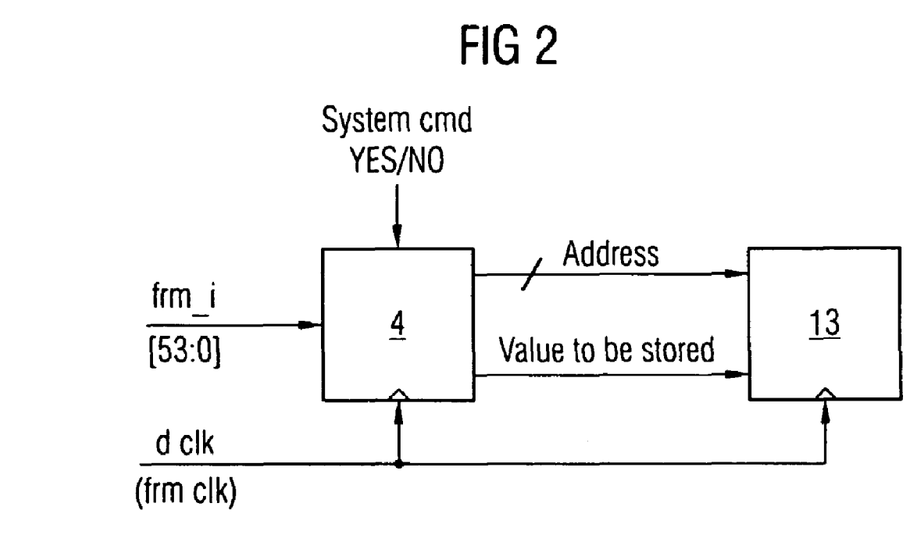
FIG. 2 schematically outlines the functional interconnections between the system command evaluator/generator section and the corresponding system mode register.
Figure 3:
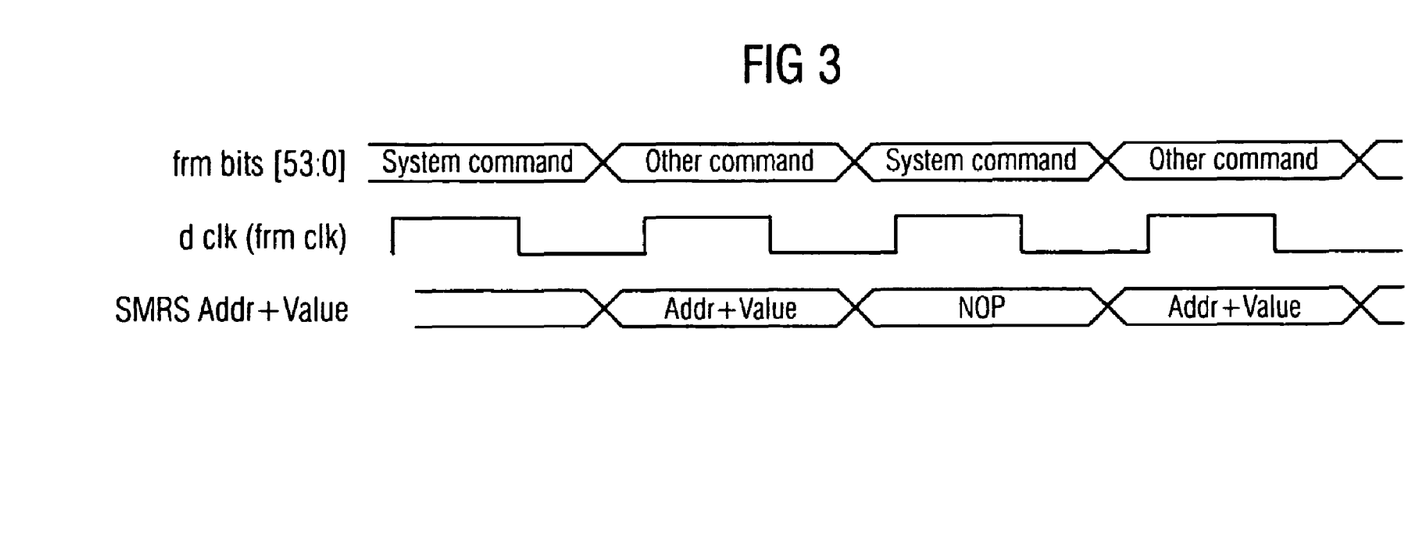
FIG. 3 shows wave forms of a signal time diagram representing incoming system command frames and access to the system mode register according to FIG. 2.

FIG. 2 depicts the system command evaluator/generator section 4 and its connection to the corresponding system mode register 13. Both units, the system command evaluator/generator section 4 and the system mode register (SMRS) 13, are clocked by the same synchronizing decoder clock dclk or alternatively by the frame clock signal frmclk. The system command/evaluator generator section 4 provides an address and a value to be stored, that is, a number of clock cycles of the clock dclk (frmclk) corresponding to each system command (FIG. 3). For other system commands, the system command evaluator/generator section 4 may access the master global control finite state machine 15, if necessary. Though not explicitly shown in FIG. 2, the system commands can trigger not only register read/write but also other system actions as "power down." Each frame including a system command is evaluated by the system command evaluator/generator section 4 with the first rising edge of the clock signal dclk or frmclk and written to the system mode register 13 with the following clock edge (refer to FIG. 3). However, FIGS. 2 and 3 show only an example how the filing parameters necessary for the counter comparison (FIG. 4) can be stored.

Figure 4:
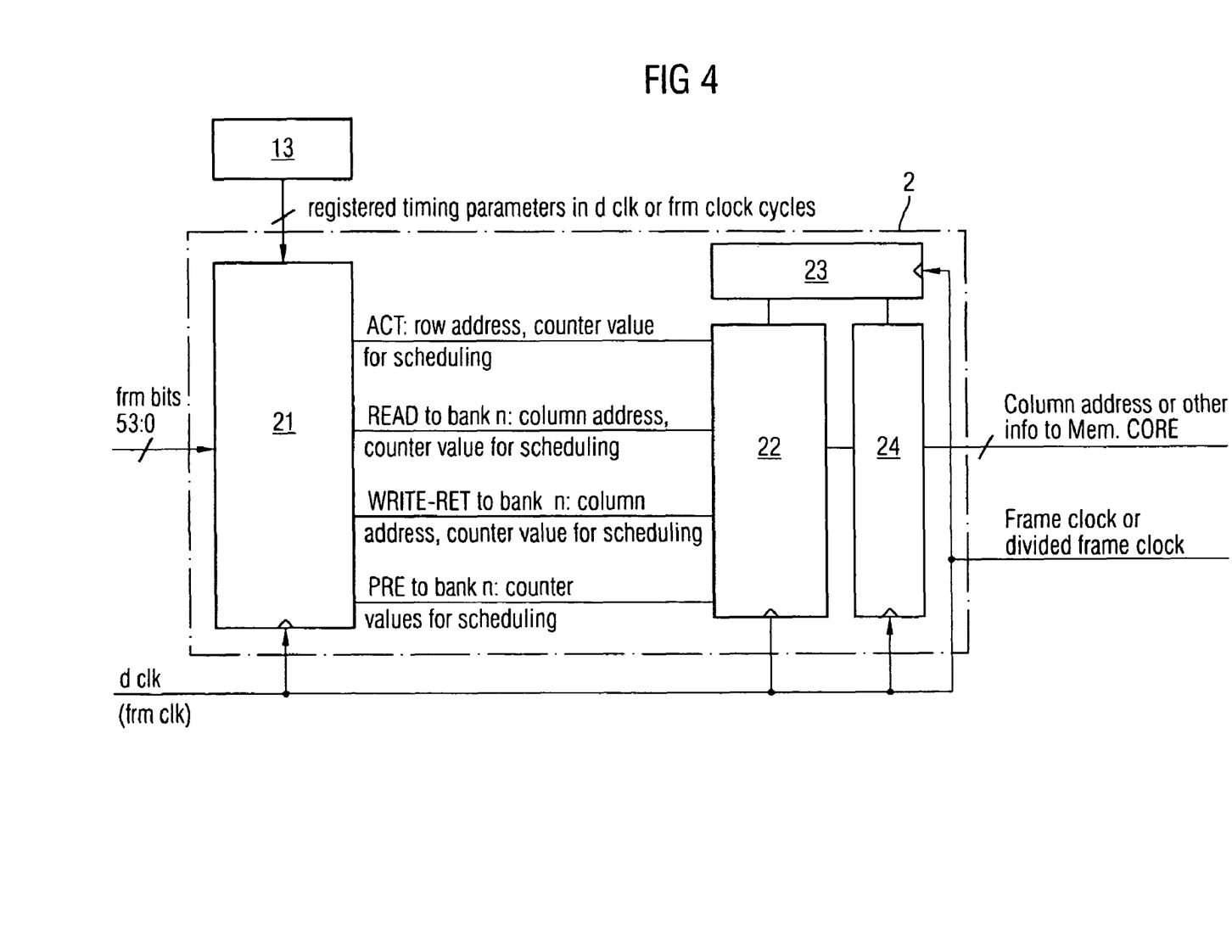
FIG. 4 is a more detailed block diagram of the memory command evaluator/generator section of the frame decoder which includes an evaluating and generating unit, a command buffer, a counting unit and a comparator unit in combination constituting an interface of the frame decoder to the memory core.

The functional block diagram of FIG. 4 schematically depicts details of the memory command evaluator/generator section 2. The latter includes a memory command evaluating and generating unit 21 and for each memory bank a command buffer unit 22 adapted for buffering one or more memory commands included in a presently decoded signal frame and, if defined by the protocol for a presently decoded command, buffering the last command of a preceding frame as well as buffering a timing parameter from the system mode register 13 in association to each respectively buffered command. A counter 23 is arranged in the memory command evaluator/generation section 2 for counting clock cycles of the synchronizing decoder clock dclk or alternatively the frame clock signal frmclk, and comparator 24 is arranged for comparing a count value of the counter 23 with a timing parameter buffered in the command buffer 22 in association to the presently decoded command. Reset means (not shown) are provided for resetting the counter 23. Each time, the comparator 24 detects matching between the value of the counter 23 and the associated buffered timing parameter, the command buffer unit 22 releases the command such as a column address or other information to the respective memory bank of the core and enables the reset means (not shown) to reset the counter 23.

The normal operation mode of the frame decoder is mainly decoding of memory command frames. For this purpose, the memory controller sends frames with memory commands embedded. The memory command evaluator/generator section 2 works on a per bank basis. The incoming frame is decoded, considering if one or more memory commands are embedded. If two or more memory commands are embedded, the command evaluating and generating unit 21 arranges them in the correct consecutive order. For example the combined memory commands ACT+READ are brought in the order: 1) ACT; 2) READ. With the last frame having access to this bank, the last memory command has been stored in the command buffer unit 22. With this information the timing parameters are derived from the system mode register 13 on a command-to-command basis and provided with a certain command to the command buffer unit 22.

In general, the size of this command history depends strongly on the memory controller. The more timing parameters are ensured by the memory controller, the less check is necessary in the semiconductor memory chip. In a worst case, if the memory controller ensures nearly no timing parameters, the check of tRC (RAS cycle time) that is the time period from ACT to ACT with other commands in between or tRRD, that is the time period from ACT of a first bank A to ACT of a second bank B could be necessary. In the present embodiment, it is assumed that the memory controller ensures most of the timing parameters and that the frame decoder has to assure and check only the relevant timing parameters between two consecutive commands, i.e., two consecutive combination commands within one frame, a command of a preceding frame but relating to a command of the present frame and optionally consecutive inter-bank commands.

Figure 5:
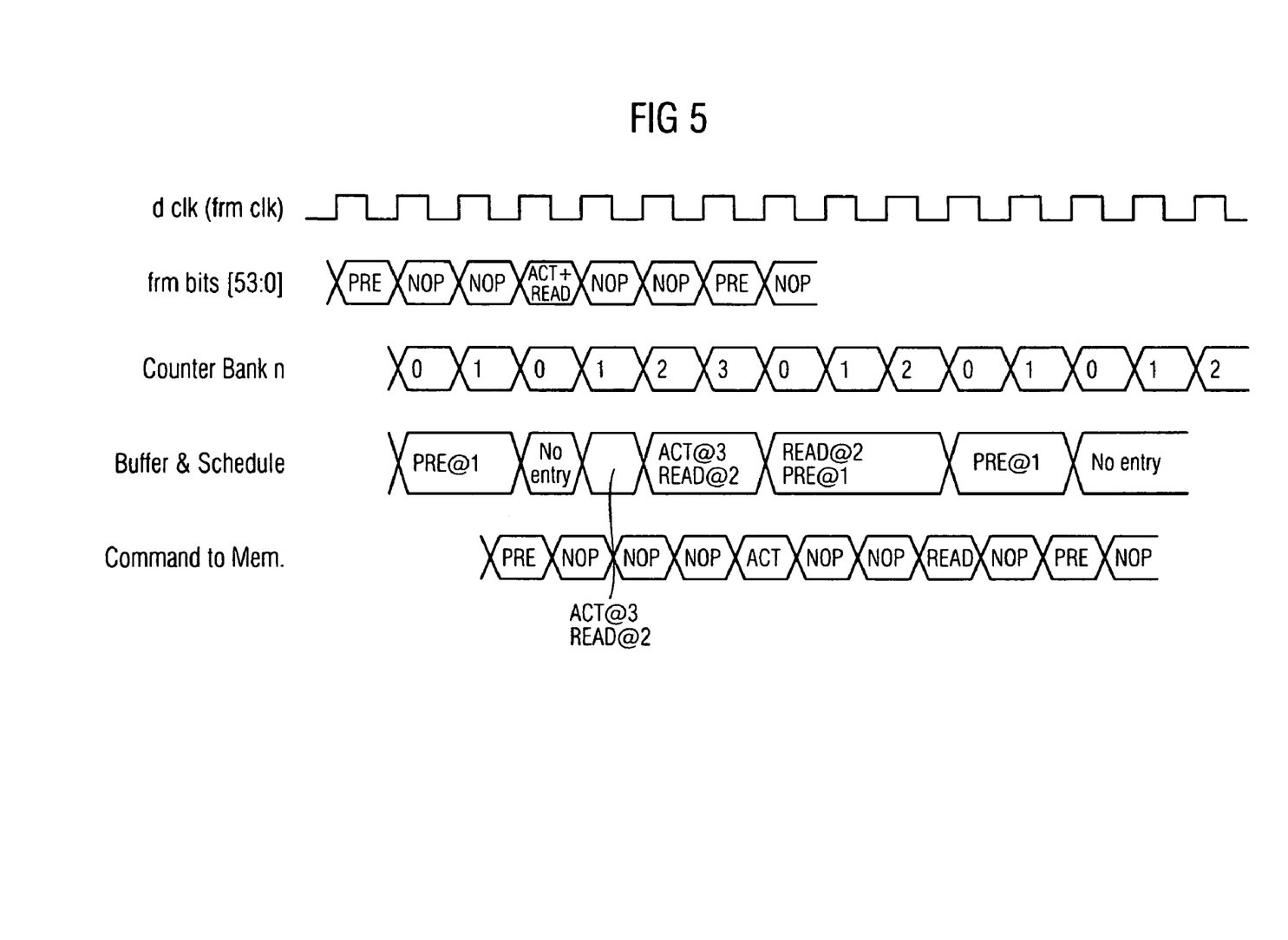
FIG. 5 depicts a signal time diagram showing wave forms at/in the memory command evaluator/generator section according to FIG. 4.

The signal time diagram of FIG. 5 illustrates an operational example of the memory command evaluator/generator section 2 as depicted in FIG. 4 in cooperation with the system mode register 13. As depicted in FIG. 5 a last command was PRE. Now a frame with combined commands ACT+READ arrives. The command evaluating and generating unit 21 brings the combined commands in the correct order: 1) ACT; 2) READ. For PRE to ACT, a minimum time exists: tRP (FIG. 6). For ACT—besides a potential enable signal—row address and bank address and also this timing parameter tRRP as a number of clock cycles of dclk or frmclk are provided. For ACT to READ, there is also a minimum time: tRCD (refer to FIG. 6). In the same manner as for ACT, for READ, a column address, bank address, and the timing parameter tRCD in a number of clock cycles are provided. These commands and the clock cycle number for the respective timing parameters tRP and tRCD are provided to the counter 23 and to the command buffer unit 22. The size of the counter 23 is derived from the greatest possible minimum time parameter between two consecutive commands.

New command(s) is (are) written to the command buffer unit 22. The counter 23 counts with every clock cycle of the clock signal dclk or frmclk. If the counter value is equal to the timing value of the first command, this command is provided to the CORE. Then the counter 23 is reset by the reset means (not shown in FIG. 4) and starts to count again until the counter value is equal to the timing value of the second command—this command is provided to the CORE. The situation repeats again and again when new commands are written to the command buffer unit 22.

Assume that a second command was the last one for the time being, i.e., a further command will be provided with one of the next frames: releasing the second command to the CORE, the counter is reset and starts counting again. When it reaches its maximum counter value, it stops without returning to the start value. Then two possibilities exist for the arrival of further commands:

a) A command arrives before the maximum counter value has been reached. If the timing value of the incoming command is smaller than the counter value, the command can be provided to the CORE with the next clock cycle without any delay. Otherwise, it has to wait until the counter value and the timing value of the command are equal.

b) A command arrives when the counter 23 has reached its maximum value. Then, there is no risk that the incoming command can violate any timing parameter. The counter 23 is reset and the command released to the CORE.

It is to be noted, that the symbols @1, @2, @3 in the fourth line of the signal time diagram of FIG. 5 are symbolizing the value in clock cycles of each minimum time according to the timing parameters associated to the respective memory command.

In FIG. 4, the memory command evaluator/generator section 2 of the preferred embodiment of the frame decoder of the present semiconductor memory chip shows only one counter 23, one command buffer unit 22 and one comparator 24. However, the counter 23, the command buffer unit 22 and the comparator 24 could be realized on a per bank basis. This depends strongly on the timing parameters implicitly ensured by the memory controller.

In view of a possible pin count restriction of the present semiconductor memory chip, internal busses thereof are multiple purpose busses that are used for multiple signal kinds. In view of this, inter-bank commands, for example read A—read B necessitate an insurance of the timing parameters for such inter-bank commands, here the timing parameter tCCD (refer to FIG. 6). In case these timing parameters are not ensured by the memory controller, the frame decoder of the present semiconductor memory chip has to ensure/meet these timing parameters. Therefore, the memory command evaluator/generator section 2 optionally can include at least one additional (second) counter for ensuring for all memory banks in common the inter-bank timing parameters.

Having described preferred embodiments of new and improved semiconductor memory chip, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

LIST OF REFERENCE SIGNS

1 command type decoding section
2 memory command evaluator/generator section
3 intermediate data buffer command evaluator/generator section
4 system command evaluator/generator section
5 wrong command protection unit
10 frame decoder
11 memory core interface
12 CRC bit decoder
13 system mode register
14 intermediate data buffer (IDB)
15 master global control finite state machine (system controller)
CORE memory core
frm_i frame input
dclk synchronization decoder clock
frmclk frame clock
21 command evaluator and generator
22 command buffer
23 counter unit
24 comparator unit
PRE pre-command
NOP no operation
ACT ACT command
READ read command

What is claimed is:

1. A semiconductor memory chip, comprising:
transmission and reception interface sections for respectively transmitting and receiving data, command, and address signals in serial signal frames configured in accordance with a predefined protocol via respective data, command, and address signal lines to/from a memory controller and/or to/from another same memory chip;
an intermediate data buffer configured for intermediate storage of write data;
a memory core including a bank-organized memory cell array and address decoder for decoding an address derived from a signal frame received from the reception interface section for writing/reading data in/from at least one memory bank of the memory cell array in accordance with a write/read command within one or more received signal frames;
a system mode register configured to store command-relevant timing parameters not being supplied in an actual frame from the memory controller, the timing parameters respectively indicating a number of clock cycles of a synchronizing decoder clock signal; and
a frame decoder providing an interface between the memory core and the reception interface section and receiving frame signals from and the reception interface section, the frame decoder including:
a command type decoding section arranged configured to decode a command type of one or more commands included in one or more frames and outputting control signals in accordance with each decoded type of the commands;
a memory command evaluator/generator section configured to schedule and prepare commands for the memory core;
an intermediate data buffer command evaluator/generator section configured to schedule and prepare control signals for the intermediate data buffer; and
a system command evaluator/generator section configured to prepare and schedule system commands, wherein:
the memory command evaluator/generator, intermediate data buffer command evaluator/generator, and system command evaluator/generator sections are operated by control signals received from the command type decoding section in accordance with the decoded type of the commands; and
at least the memory command evaluator/generator section, the intermediate data buffer, and the intermediate data buffer command evaluator/generator section are operable in synchronism with the synchronizing decoder clock signal.

2. The semiconductor memory chip of claim 1, wherein the reception interface section further includes a CRC-bit decoder configured to evaluate CRC-bits within the signal frames and to check correctness/incorrectness of commands and data in each signal frame, wherein the frame decoder further includes a wrong command protection unit for releasing to the memory core only commands checked by the CRC-bit decoder as being correct.

3. The semiconductor memory chip of claim 1, wherein the memory command evaluator/generator section includes a command evaluator and generator and for each memory bank of the memory core:
a command buffer configured to buffer: a) one or more memory commands included in a presently decoded signal frame and in previous commands and, if defined by the protocol for a presently decoded command, the last command of the preceding frame; and b) a time parameter from the system mode register in association with each buffered command;
a counter unit configured to count clock cycles of the synchronizing decoder clock signal;
a comparator configured to compare a count value of the counter unit with a buffered timing parameter associated with the presently decoded command; and
a reset unit configured to reset the counter unit, wherein:
each time the comparator detects matching between the count value of the counter unit and the associated buffered timing parameter, the command buffer releases the command to the respective memory bank and enables the reset unit to reset the counter unit.

4. The semiconductor memory chip of claim 3, wherein, if two or more commands are buffered in the command buffer, the command evaluator and generator of the memory command evaluator/generator section rearranges the memory commands in the correct consecutive order, and with the last frame by which a certain memory bank has been accessed and from which the last memory command has to been stored in the command buffer derives the timing parameters from the system mode register on a command-to-command basis, and stores the timing parameters respectively associated with the rearranged commands in the command buffer.

5. The semiconductor memory chip of claim 3, wherein the size of the counter unit is in accordance with a greatest possible minimum timing parameter between two consecutive commands.

6. The semiconductor memory chip of claim 3, wherein the counter unit includes a first counter provided for each bank of the memory cell array and configured to measure respective timing parameters of multiple intra-bank commands; and
the command evaluator and generator of the memory command evaluator/generator section includes at least one second counter configured to measure timing parameters of inter-bank commands.

7. The semiconductor memory chip of claim 1, wherein the frame decoder and the memory command evaluator/generator section are synchronized by the decoder clock signal to release data and commands to the memory core at a clock edge of the decoder clock signal.

8. The semiconductor memory chip of claim 1, wherein the decoder clock signal is synchronous with and has a frequency equal to or higher than the frequency of a frame clock signal which synchronizes the incoming frames at the reception interface section.

9. The semiconductor memory chip of claim 1, wherein the frequency of the synchronizing decoder clock signal is higher than the operating frequency of the memory core.

10. The semiconductor memory chip of claim 9, wherein the memory core's operation is not in synchronism with the decoder clock signal.

11. The semiconductor memory chip of claim 9, wherein the ratio of the synchronizing decoder clock signal frequency and the operating frequency of the memory core is in a range from 2 to 5.

* * * * *